US008988963B2

(12) United States Patent
Hu et al.

(10) Patent No.: US 8,988,963 B2
(45) Date of Patent: Mar. 24, 2015

(54) INTERMEDIATE CIRCUIT AND METHOD FOR DRAM

(71) Applicant: International Business Machines Corporation, Armonk, NY (US)

(72) Inventors: Qian Hu, Shanghai (CN); Yu fei Li, Shanghai (CN); Hao Yang, Shanghai (CN); Wei Wei, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/038,890

(22) Filed: Sep. 27, 2013

(65) Prior Publication Data

US 2014/0092699 A1    Apr. 3, 2014

(30) Foreign Application Priority Data

Sep. 28, 2012    (CN) .......................... 2012 1 0366774

(51) Int. Cl.
  *G11C 8/00*    (2006.01)
  *G06F 13/00*   (2006.01)
  *G11C 11/406*  (2006.01)

(52) U.S. Cl.
  CPC ........ *G11C 11/406* (2013.01); *G11C 11/40611* (2013.01)
  USPC ......................... 365/222; 365/233.1; 711/106

(58) Field of Classification Search
  USPC ....................................................... 365/222
  See application file for complete search history.

(56) References Cited

U.S. PATENT DOCUMENTS

| | | | |
|---|---|---|---|
| 5,835,401 A | 11/1998 | Green et al. | |
| 6,445,636 B1 | 9/2002 | Keeth et al. | |
| 6,646,944 B2 | 11/2003 | Shimano et al. | |
| 6,757,784 B2 | 6/2004 | Lu et al. | |
| 6,826,106 B2 | 11/2004 | Chen | |
| 7,042,777 B2 | 5/2006 | Oh | |
| 7,117,299 B2* | 10/2006 | Ryan | 711/106 |
| 7,146,454 B1 | 12/2006 | Li et al. | |
| 7,885,134 B2 | 2/2011 | Li et al. | |
| 2011/0255360 A1 | 10/2011 | Takahashi | |
| 2013/0268727 A1* | 10/2013 | Sohn et al. | 711/105 |

OTHER PUBLICATIONS

Reineke, Jan, et al.—"PRET DRAM Controller: Bank Privatization for Predictability and Temporal Isolation"—Codes +ISSS'11, Oct. 9-14, 2011 Taipei, Taiwan—Copyright 2011.

(Continued)

*Primary Examiner* — Son Mai
(74) *Attorney, Agent, or Firm* — Joseph P. Abate (57) ABSTRACT

An intermediate circuit and method for hiding refresh confliction. The intermediate circuit includes: a first control circuit configured to generate a Command Output Enable signal CON, a Data Read Enable signal DRN and a Refresh Enable signal REFN based on the second clock, wherein a ration of duration the signal CON is in a first state to duration in a second state equals to CLK2/(CLK1-CLK2), the signal REFN has a state that is reverse to that of the signal CON and is used to refresh the DRAM; a command buffer configured to store the access commands received from the user interface and output the stored access commands to the DRAM in response to the first state of the signal CON; a data buffer configured to read data from the DRAM in response to the first state of the signal CON and output the read data.

18 Claims, 4 Drawing Sheets

(56) References Cited

OTHER PUBLICATIONS

Mohammad Alizadeh, Adel Javanmard, Shang-Tse Chuang, Sundar Iyer, Yi Lu—"Versatile Refresh: Low Complexity Refresh Scheduling for High-Throughput Multi-Banked Edram"—Proceeding SIGMETRICS '12 Proceedings of the 12th ACM Sigmetrics/Performance joint international conference on Measurement and Modeling of Computer Systems pp. 247-258—URL: http://dl.acm.org/citation.cfm?id=2254756.2254787 , Jun. 2012.

* cited by examiner

INTERMEDIATE CIRCUIT AND METHOD FOR DRAM

CROSS-REFERENCE STATEMENT

This application claims priority under 35 U.S.C. §119 from Chinese Patent Application No. 201210366774.7 filed Sep. 28, 2012, the entire contents of which are incorporated herein by reference.

BACKGROUND

1. Field of the Invention

The present invention relates to DRAM, and more specifically, to an apparatus and method for controlling refreshing of and accessing to DRAM.

2. Related Art

Static Random-Access Memory (SRAM) and Dynamic Random-Access Memory (DRAM) are commonly used memory today. SRAM is a traditional type of memory with static access capability, which has good performance and simpler interface. As compared to SRAM that generally needs six transistors to store one bit, DRAM only needs one transistor and one capacitor to store one bit, thus having simpler structure and higher storage density. However, since DRAM stores data by utilizing charges stored in the capacitor and the capacitor needs to be charged periodically to prevent leakage of electricity, DRAM requires a refresh circuit to periodically refresh storage cell to ensure that stored data will not get lost. There is no need to perform refreshing in SRAM.

During the process of refreshing a DRAM, target memory bank of the refresh operation must be different from the one on which a read/write operation is currently conducted, that is, a refresh operation and an access operation can not be performed on a same memory bank simultaneously. Here, memory bank is the minimal unit which can NOT accept both access and refresh operation at one time slot. Many algorithms have been proposed in the art to make refresh confliction as less as possible. However, in practice, refresh confliction can not be fully prevented and eliminated by merely optimizing refresh policy.

Since refresh confliction is always inevitable, time delay in reading data in a DRAM is un-fixed. For example, in a worst case, user continuously reads a same memory bank via a series of access commands. To maintain integrity of data in that memory bank, a refresh controller of the DRAM will issue a mandatory refresh command and insert the command into the access command sequence. Thus, the series of access commands will be interrupted, and access operation on that memory bank will not be resumed until refresh operation is completed. That is, in case that there is refresh-access confliction, the memory bank first performs mandatory refresh operation, and access operation will be resumed only after refresh operation is completed. Thus, access operation on data is delayed and read out time of data is prolonged. Therefore, in DRAM, data access time is un-fixed.

However, a variable data access time adds complexity in design of other components related to DRAM and brings additional overhead. Therefore, there is need for a DRAM that has fixed data access time like SRAM, while keeping its advantage of high density and low power consumption.

SUMMARY OF THE INVENTION

One aspect of the invention includes an intermediate circuit for DRAM, the intermediate circuit coupled between a user interface and the DRAM, the user interface transmitting access commands at a first clock, the DRAM operating at a second clock and being refreshed via a refresh controller, where clock cycle of the first clock is greater than clock cycle of the second clock. The intermediate circuit includes: a first control circuit configured to generate a Command Output Enable signal and a Refresh Enable signal based on the second clock, where the Command Output Enable signal has a first state and a second state, where a ratio of duration of the first state to that of the second state is the second clock cycle divided by the difference between the first clock cycle and the second clock cycle, and where the Refresh Enable signal has a state that is reverse to that of the Command Output Enable signal and is applied to the refresh controller, a command buffer configured to i) store the access commands received from the user interface and ii) output the stored access commands to the DRAM when the Command Output Enable signal is in the first state, and a data buffer configured to read data from the DRAM and output the read data to the user interface.

Another aspect of the invention includes a method for controlling DRAM, the method being performed between a user interface and the DRAM, the user interface transmitting access commands at a first clock, the DRAM operating at a second clock and being refreshed via a refresh controller, where a clock cycle of the first clock is greater than a clock cycle of the second clock. The method includes: generating a Command Output Enable signal and a Refresh Enable signal based on the second clock, where the Command Output Enable signal has a first state and a second state, a ratio of duration of the first state to that of the second state is the second clock cycle divided by the difference between the first clock cycle and the second clock cycle, the Refresh Enable signal has a state that is reverse to that of the Command Output Enable signal and is applied to the refresh controller, storing the access commands received from the user interface, outputting the stored access commands to the DRAM when the Command Output Enable signal is in the first state, and reading data from the DRAM and outputting the read data to the user interface.

BRIEF DESCRIPTION OF THE OF THE DRAWINGS

Embodiments of the invention will be described below in conjunction with accompany drawings, in which.

DETAILED DESCRIPTION OF THE PREFERRED EMBODIMENTS

The present invention is proposed in view of the above problem in the art, so as to hide refresh confliction of DRAM at user interface.

Therefore, according to one embodiment of the present invention, there is provided an intermediate circuit for DRAM coupled between a user interface and the DRAM, the user interface transmitting access commands at a first clock, the DRAM operating at a second clock and being refreshed via a refresh controller, where clock cycle CLK1 of the first clock is greater than clock cycle CLK2 of the second clock, the intermediate circuit including: a first control circuit configured to generate a Command Output Enable signal CON and a Refresh Enable signal REFN based on the second clock, where the Command Output Enable signal CON has a first state and a second state, a ratio of duration of the first state to that of the second state is equal to CLK2/(CLK1-CLK2), and the Refresh Enable signal REFN has a state that is reverse to that of the Command Output Enable signal CON and is applied to the refresh controller, a command buffer configured to store the access commands received from the user interface and output the stored access commands to the DRAM when the Command Output Enable signal CON is in the first state, a data buffer configured to read data from the DRAM and output the read data to the user interface.

According to another embodiment of the present invention, there is provided a method for DRAM, performed between a user interface and the DRAM, the user interface transmitting access commands at a first clock, the DRAM operating at a second clock and is refreshed via a refresh controller, where clock cycle CLK1 of the first clock is greater than clock cycle CLK2 of the second clock, the method including: generating a Command Output Enable signal CON and a Refresh Enable signal REFN based on the second clock, where the Command Output Enable signal CON has a first state and a second state, a ratio of duration of the first state to that of the second state is equal to CLK2/(CLK1-CLK2), and the Refresh Enable signal REFN has a state that is reverse to that of the Command Output Enable signal CON and is applied to the refresh controller, storing the access commands received from the user interface and outputting the stored access commands to the DRAM when the Command Output Enable signal CON is in the first state, reading data from the DRAM and outputting the read data to the user interface.

With the intermediate circuit and method of embodiments of the invention, refresh confliction in a DRAM can be hidden, so that fixed access latency can be obtained at user interface.

The implementation idea of the invention will be described below in conjunction with features of DRAM.

In prior art, DRAM is coupled to a user interface via which a user issues an access command and receives the returned data. Assume that the time at which the access command is issued at the user interface is T0, then the time at which the returned data is received can be denoted as T0+t. As mentioned before, refresh confliction is inevitable in a DRAM. When refresh confliction occurs, access operation on data is suspended, so that t is not a fixed value for different read operations. It is set forth by inventors of the present invention that, by designing transmission timing of access command and returned data, for any read operation, t can be a fixed value as long as clock cycle of the user interface CLK1 and clock cycle of the DRAM CLK2 are fixed. That is to say, returned data are received at the user interface with same latency, such that refresh confliction is hided. Then, from the perspective of the user interface, a DRAM with fixed data access latency is acquired.

To acquire a fixed time t at which data is returned, transmission timing of access command and returned data needs to be arranged by referencing to timing of DRAM's refresh operation, so as to obtain the time required by DRAM's refresh operation. Generally, a user interface often has a clock cycle different from that of a DRAM. In a typical case, clock cycle CLK1 of a user interface will be greater than clock cycle CLK2 of a DRAM. Then, DRAM's refresh operation can be arranged by utilizing clock difference between CLK1 and CLK2. On basis that DRAM's refresh arrangement is determined, access command and returned data can be buffered, so as to adjust their transmission timing, eventually making the read data arrive at the user interface with same latency t.

The implementation of the above inventive idea will be described below in conjunction with detailed embodiments by referencing to accompany drawings.

Figure 1:
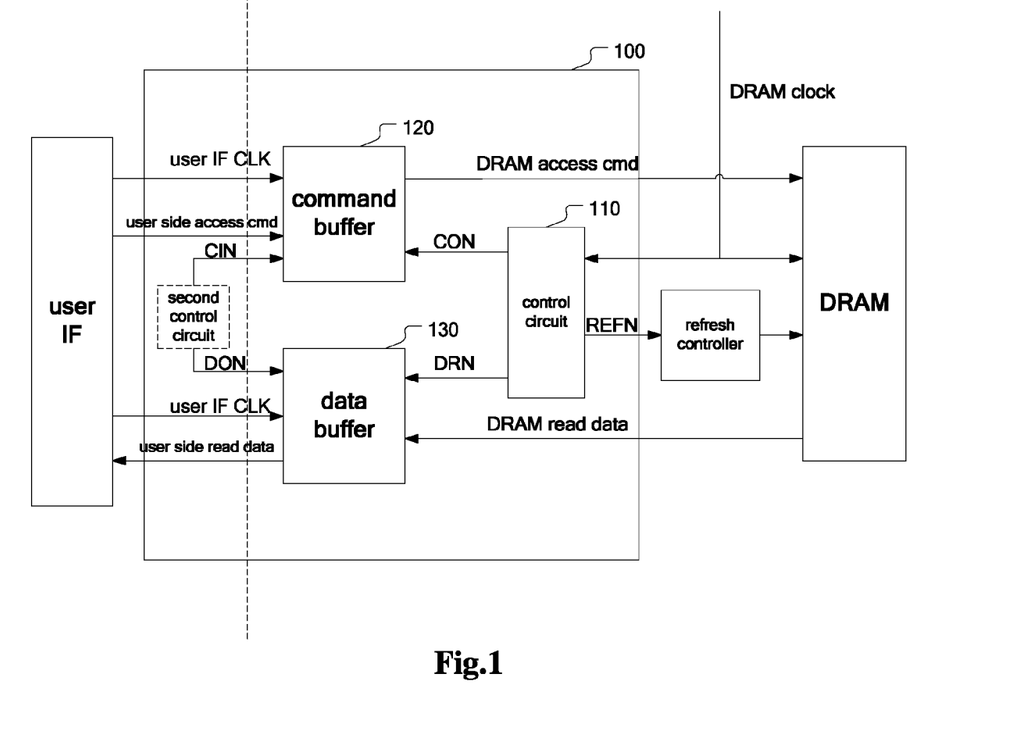
FIG. 1 shows a structural diagram of an intermediate circuit according to an embodiment of the present invention.

FIG. 1 shows a structural diagram of an intermediate circuit according to an embodiment of the present invention. As shown, the intermediate circuit is generally depicted as 100. The intermediate circuit 100 is coupled between a user interface (IF) and a DRAM, where the user interface operates at a first clock and the DRAM operates at a second clock, and clock cycle CLK1 of the first clock is greater than clock cycle CLK2 of the second clock. Further, the DRAM is refreshed via a refresh controller. In particular, at the side that couples to the user interface, the intermediate circuit 100 obtains a first clock cycle CLK1 and access commands transmitted at CLK1, and returns the read data to the user interface. At the other side, the intermediate circuit 100 transmits access commands to the DRAM and reads data directly from the DRAM. In addition, the intermediate circuit 100 further provides a Refresh Enable signal to the DRAM's refresh controller.

Next, internal structure of the intermediate circuit 100 will be described. As shown in FIG. 1, the intermediate circuit 100 includes a control circuit 110, a command buffer 120 and a data buffer 130. The control circuit 110 is used to generate a plurality of control signals, so as to control operation timing for the command buffer 120, data buffer 130 and DRAM's refresh controller respectively. Specifically, the control circuit 110 generates a Command Output Enable signal CON and a Refresh Enable signal REFN based on CLK2, where the Command Output Enable signal CON is used to control timing at which the command buffer 120 forwards an access command to the DRAM, while the Refresh Enable signal REFN is transmitted to DRAM's refresh controller and is used to control timing of DRAM's refresh operation. In an embodiment, the control circuit further generates a Data Read Enable signal DRN, which is used to control timing at which the data buffer 130 reads data from the DRAM.

The control circuit 110 is configured to make the above generated signals have following features. The Command Output Enable signal CON has a first state and a second state, a ratio of duration of the first state to that of the second state is equal to CLK2/(CLK1-CLK2). For example, the first state may be high level, and the second state may be low level. The Data Read Enable signal DRN has the same state distribution but a first delay as compared to the Command Output Enable signal CON, whereas the Refresh Enable signal REFN has a state that is reverse to that of the Command Output Enable signal CON.

The command buffer 120, data buffer 130 and refresh controller may operate at a predetermined "tempo" under control of the above respective signals.

Specifically, the command buffer 120 continuously receives access commands transmitted at the first clock cycle CLK1 from the user interface, buffers the received access commands, and outputs the stored access commands to the DRAM at the second clock cycle CLK2 when the Command Output Enable signal CON is in a first state. The data buffer 130 reads data from the DRAM at the second clock cycle CLK2 when the Data Read Enable signal DRN is in a first state, for example, and outputs the read data to the user interface at the first clock cycle CLK1. Since the control circuit 110 further provides a Refresh Enable signal REFN to DRAM's refresh controller, the refresh controller is able to control DRAM's refresh operation based on that Refresh Enable signal REFN.

Accordingly, when the Command Output Enable signal CON is in the first state, the command buffer 120 transmits the buffered access commands to the DRAM at the second cycle CLK2. Since the Data Read Enable signal DRN has a same state distribution as the Command Output Enable signal CON but with a first delay, the data buffer 130 reads data corresponding to the above access commands from the DRAM after the first delay has been passed. Here, the first delay is relevant to data read delay of the DRAM itself, i.e., the time from sending an access command to the interface of the DRAM to data is presented at the interface of the DRAM. Next, the data buffer 130 buffers and stores the read data and outputs them to the user interface at the first clock cycle CLK1.

When the Command Output Enable signal CON is in the second state, the command buffer 120 still continuously receives access commands. However, the access commands are not outputted to the DRAM. Accordingly, the data buffer 130 also does not read data. Since the Refresh Enable signal REFN has a state that is reverse to that of the Command Output Enable signal CON, the Refresh Enable signal REFN is in the first state at this moment. Then, the refresh controller controls the DRAM to perform refresh operation.

It is appreciated that, the above Data Read Enable signal DRN is used to control the timing at which the data buffer 130 reads data. Due to inherent delay dly0 the DRAM has in reading data, the data buffer 130 can get data from the DRAM only after that delay dly0. Therefore, in an example, instead of using the control signal to control read timing of the data buffer 130, the data buffer 130 is set such that, once DRAM has data ready at its interface, the data buffer 130 reads the data from the DRAM. As such, there naturally exists the above inherent delay dly0 from the time the command buffer 120 outputs access commands to the DRAM to the time the data buffer 130 obtains data from the DRAM. Here, the inherent delay dly0 functions as the above first delay. However, by setting the above Data Read Enable signal DRN, in addition that the first delay is displayed more clearly, the timing of reading data may be further delayed on basis of the naturally generated inherent delay dly0. That is, the first delay may be greater than or equal to inherent delay dly0 of the DRAM. For purpose of clarity, embodiments of the invention will still be described below in conjunction with examples with the Data Read Enable signal DRN.

As stated above, the first clock cycle CLK1 is greater than the second clock cycle CLK2, or clock frequency of the DRAM is higher than that of the user interface, and a ratio of duration of the first state to that of the second state in the Command Output Enable signal CON is equal to CLK2/(CLK1-CLK2). This means that, under control of respective signals issued by the control circuit 110, the DRAM performs data read operation based on access command in the duration corresponding to CLK2, and performs refresh operation in the duration corresponding to (CLK1-CLK2). That is to say, the intermediate circuit 100 makes DRAM perform refresh operation by utilizing the difference (CLK1-CLK2) between the two clock cycles, and meanwhile "waits" subsequent access commands. Since the read data is buffered by taking into consideration DRAM's ratio of access operation to refresh operation, a fixed read latency will be obtained at the user interface. Specifically, the time slot from the moment the user interface issues an access command to the moment the read data is presented at the user interface is referred to as a second delay. This second delay is the data read latency perceived by a user.

In one embodiment, to show the second delay more clearly, the command buffer 120 is configured to receive access commands from the user interface under control of a Command Input Enable signal CIN, and the data buffer 130 is configured to output data to the user interface under control of a Data Output Enable signal DON, where both the Command Input Enable signal CIN and the Data Output Enable signal DON are in enabled state, but the Data Output Enable signal DON has a second delay relative to the Command Input Enable signal CIN. Accordingly, the intermediate circuit 100 of FIG. 1 may contain a second control circuit (shown in dashed line) configured to generate the above Command Input Enable signal CIN and Data Output Enable signal DON.

In the intermediate circuit of FIG. 1, to realize buffer function for command and data, in one embodiment, both the command buffer 120 and the data buffer 130 are implemented by a First-In-First-Out (FIFO) type buffer. In an example, the FIFO type buffer may be build based on RAM memory. Those skilled in the art may also employ other suitable types of buffer as needed.

In the above example, the command buffer 120, data buffer 130 and refresh controller all operate under control of respective control signals generated by the control circuit 110. To generate the above described Command Output Enable signal CON, Data Read Enable signal DRN and Refresh Enable signal REFN, there are many ways to implement the control circuit 110.

Figure 2:
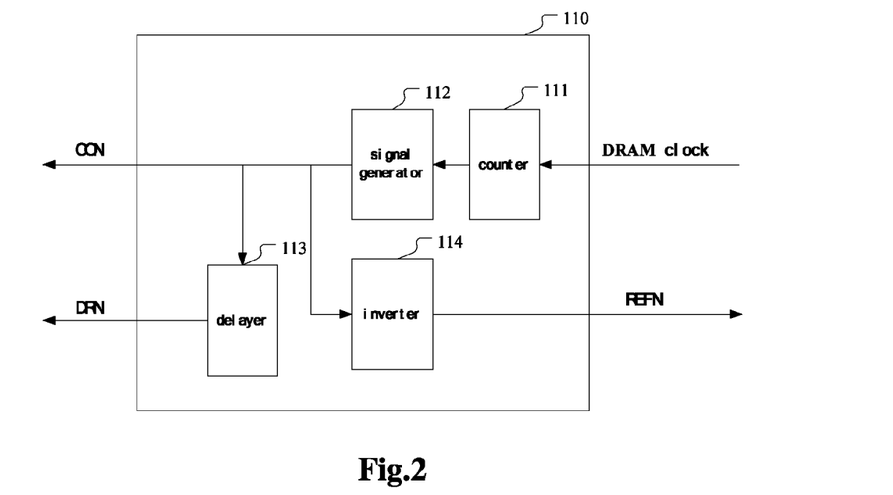
FIG. 2 shows the structure of a control circuit 110 according to an embodiment of the present invention.

FIG. 2 shows structure of the control circuit 110 according to an embodiment of the present invention. In the example of FIG. 2, the control circuit 110 includes a counter 111, a signal generator 112, a delayer 113 and an inverter 114. The counter 111 obtains clock signal of the DRAM and counts on the clocks of the DRAM. Furthermore, the counter 111 is set to reset count to 0 whenever the count reaches a predetermined value. The signal generator 112 is set to generate a Command Output Enable signal CON, and set state of the Command Output Enable signal CON based on count value of the counter 111, such that a ratio of a first state to a second state is CLK2/(CLK1-CLK2). The delayer 113 delays the Command Output Enable signal CON by a first delay, so as to obtain a Data Read Enable signal DRN. The inverter 114 inverts state of the Command Output Enable signal CON, thereby obtaining a Refresh Enable signal REFN. In an example, the inverter 114 is implemented by a NOT gate.

In an embodiment, to generate the required Command Output Enable signal CON, the counter 111 and the signal generator 112 may be set as follows. Assume CLK1: CLK2=m:n, where m and n are natural numbers. Then, the counter is set to start counting from 0, and is reset to 0 after the count reaches m-1. The signal generator 112 is set to generate a high level signal (that is, a signal in a first state) when count of the counter is 0 to n-1, and generate a low level signal (that is, a signal in a second state) when count of the counter is n to m-1. Thus, in each cycle from 0 to m-1, duration of the first state to that of the second state is n/(m-n), that is, CLK2/(CLK1-CLK2). It is appreciated that, the above counting manner and signal generating manner are merely illustrative. Other counting manner and signal generating manner are also possible, for example, the counter may be set to start counting from 1 to m. Alternatively, in another example, count range of the counter may be doubled while keeping ratio of the first state to the second state unchanged.

FIG. 2 merely illustrates one implementation of the control circuit 110. In other embodiments, the control circuit 110 may be realized in different manners. For example, in an example, the counter 111 and the signal generator 112 in FIG. 2 may be replaced by a signal generation circuit, which determines state of the signal based on a predetermined judgment criterion at each rising edge of the second clock. The predetermined judgment criterion may be whether duration of high/low level reaches a predefine value. By setting the predefined value in the judgment criterion, a ratio of duration of high level to that of low level in the signal generated by the signal generation circuit may be made to be CLK2/(CLK1-CLK2). Such a signal may be taken as the above Command Output Enable signal CON. In addition, more modifications and variations may be made by those skilled in the art under the above teaching to realize functions of the above control circuit 110.

To clearly show operation of the intermediate circuit 100 under control of the control circuit 110, timing of each control signal and operation timing of the intermediate circuit will be described below in conjunction with the control circuit 110 in the example of FIG. 2 and examples of specific clock signal.

Figure 3:
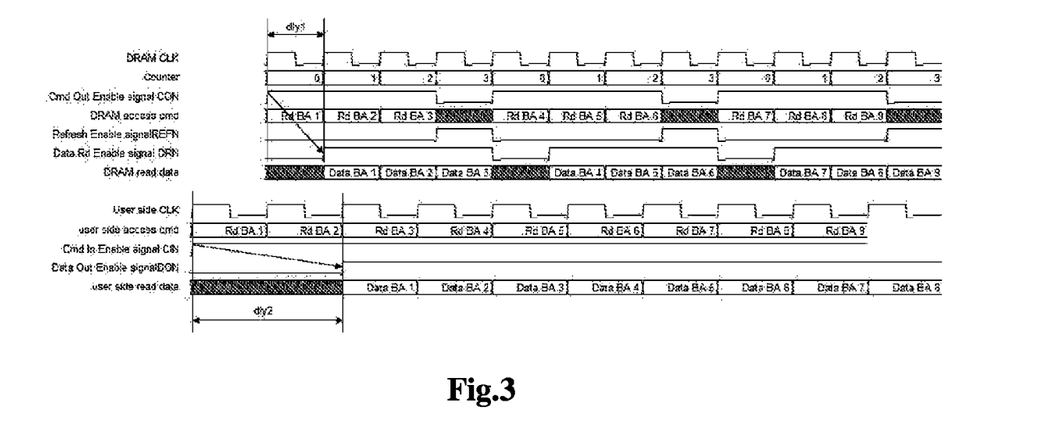
FIG. 3 shows operation timing of the intermediate circuit 100 according to an embodiment of the present invention.

FIG. 3 shows operation timing of the intermediate circuit 100 according to one embodiment. Upper portion of FIG. 3 shows operation performed at clock frequency of DRAM; the lower portion shows operation performed at clock frequency of user interface. In the example of FIG. 3, operating frequency of the user interface is 300 MHz, operating frequency of the DRAM is 400 MHz, thus a ratio of CLK1 to CLK2 is 4:3 (m=4, n=3). The counter 111 in the control circuit 110 counts clock cycle of the DRAM. The counting starts from 0, and the counter is reset to 0 when count reaches 3. When count of the counter is 0 to 2, the Command Output Enable signal CON is at high level, i.e., in a first state; when count of the counter is 3, the signal CON is at low level, i.e., in a second state. A ratio of duration of high level to that of low level is 3:1. Corresponding to the above Command Output Enable signal CON, the Data Read Enable signal DRN has same state distribution, but has a first delay dly1 relative to CON. The Refresh Enable signal REFN is set to a state that is reverse to that of the Command Output Enable signal CON.

Next, execution sequence of data read and refresh operation under control of the above respective signals will be described. First, as shown by user side access commands, the intermediate circuit continuously receives a sequence of access commands transmitted at a first clock CLK1 from the user interface, and access commands in the sequence are in turn denoted as Rd BA1, Rd BA2 . . . to indicate data in a specific bank (BA) will be read. As mentioned before, the command buffer 120 buffers the user side access commands, and outputs the access commands to the DRAM at a second clock CLK2 based on state of the Command Output Enable signal CON. Since the ratio of high level to low level in the Command Output Enable signal CON is 3:1, in the sequence of access commands outputted to the DRAM, every 4 consecutive (second) clock cycles are taken as one group and access commands are arranged only in the first 3 clock cycles of each group. In the clock cycle during which no access command is arranged, the Refresh Enable signal REFN is at high level. This means that, in this clock cycle, the refresh controller controls the DRAM so that it is refreshed. On the other hand, the Data Read Enable signal DRN has a first delay dly1 relative to the Command Output Enable signal CON. Thus, relative to the time at which a DRAM access command is issued, after time dly1, the data buffer 130 reads data corresponding to the above access command from the DRAM, as shown by the sequence of "DRAM read data".

Corresponding to the sequence of DRAM access commands, the sequence of "DRAM read data" has same distribution, that is, every 4 clock cycles are taken as one group, read data is only contained in the first 3 clock cycles in each group. After reading data from DRAM as described above, the data buffer 130 transmits the read data at the first clock CLK1 to the user interface, as shown by user side read data. It can be seen by comparing the sequence of "DRAM read data" and the sequence of "user side read data", since CLK1:CLK2=4:3, time length of every 4 second clock cycles equals to that of 3 first clock cycles. In a group composed of 4 second clock cycles, 3 clock cycles are used to perform data read operation, 1 clock cycle is used to perform refresh operation. That is, the refresh operation is inserted into a time slot corresponding to the difference of two clocks. Finally, at 2 first clock cycles after receiving user side access command, the intermediate circuit presents the read data at the user interface. Thus, in the example of FIG. 3, the second delay dly2=2CLK1.

Figure 4:
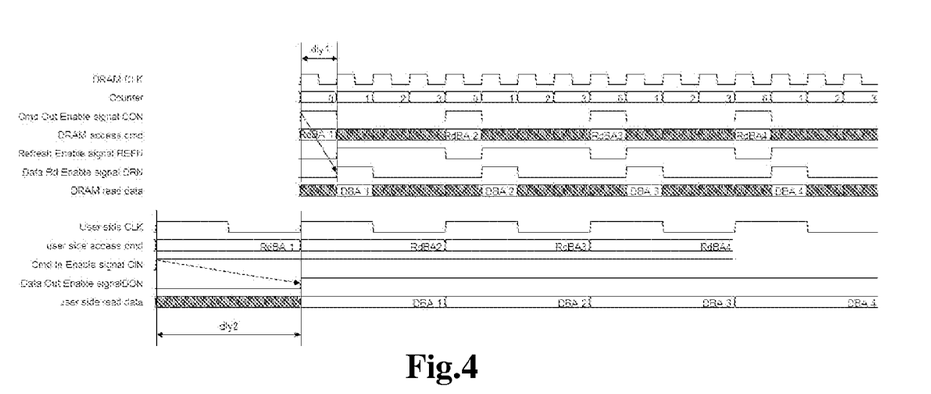
FIG. 4 shows operation timing of the intermediate circuit 100 according to another embodiment of the present invention.

FIG. 4 shows operation timing of the intermediate circuit 100 according to another embodiment. Similarly, upper portion of FIG. 4 shows operation performed at clock frequency of DRAM; lower portion shows operation performed at clock frequency of user interface. In the example of FIG. 4, the ratio of clock cycle CLK1 of user interface to clock cycle CLK2 of DRAM is 4:1 (m=4, n=1). Accordingly, the counter 111 in the control circuit 110 starts counting from 0, and is reset to 0 whenever the count reaches 3. When count of the counter is 0, the Command Output Enable signal CON is at high level; when count of the counter is 1-3, the signal CON is at low level. The ratio of duration of high level to that of low level is 1:3. Corresponding to the Command Output Enable signal CON, the Data Read Enable signal DRN has same state distribution, but with a first delay dly1 relative to CON. The Refresh Enable signal REFN is set to a state that is reverse to that of the Command Output Enable signal CON.

Under control of the above respective signals, the command buffer 120 receives user side access commands transmitted at the first clock CLK1, and outputs DRAM access commands based on state of the CON. Since the ratio of duration of high level to that of low level in the Command Output Enable signal CON is 1:3, in the sequence of DRAM access commands, every 4 (second) clock cycles are taken as one group and access commands are arranged only in the first clock cycle of each group. In the clock cycles during which no access command is arranged, the refresh controller controls DRAM so that it is refreshed. On the other hand, the sequence of DRAM read data has a first delay dly1 relative to the sequence of DRAM access commands, but with a same distribution, that is, every 4 clock cycles are taken as one group, and the read data is only contained in the first clock cycle in each group. After reading data from DRAM as described above, the data buffer 130 transmits the read data to the user interface at the first clock CLK1, as shown by user side read data. Finally, at one (first) clock cycle after receiving user side access command, the intermediate circuit presents the read data at the user interface. Thus, in the example of FIG. 4, the second delay dly2=CLK1.

Figure 5:
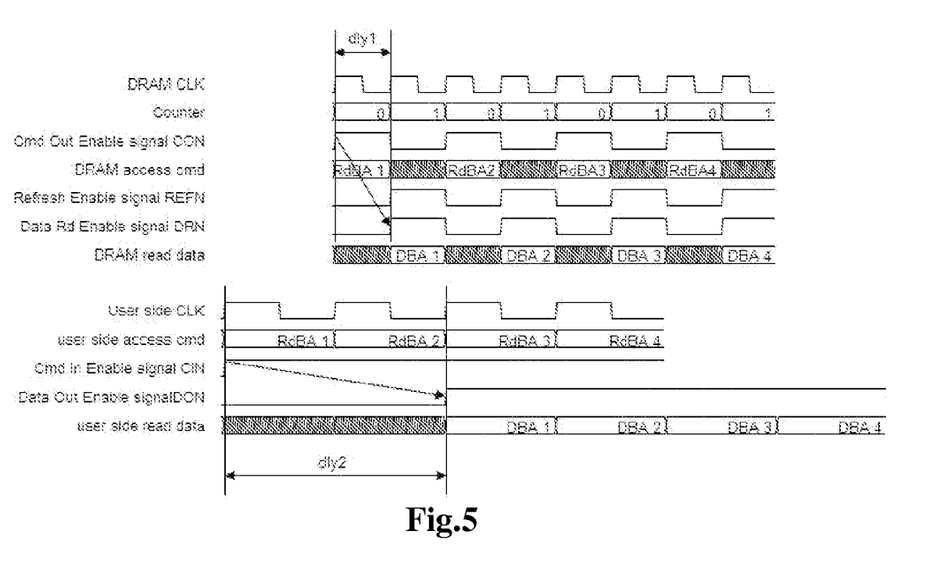
FIG. 5 shows operation timing of the intermediate circuit 100 according to yet another embodiment of the present invention.

FIG. 5 shows operation timing of the intermediate circuit 100 according to yet another embodiment. In the example of FIG. 5, the ratio of clock cycle CLK1 of user interface to clock cycle CLK2 of DRAM is 2:1 (m=2, n=1). Accordingly, the counter 111 is reset to 0 after it reaches 1. When count of the counter is 0, the Command Output Enable signal CON is at high level; when count of the counter is 1, the signal CON is at low level. The ratio of duration of high level to that of low level is 1:1. Corresponding to the Command Output Enable signal CON, the Data Read Enable signal DRN has same state distribution, but with a first delay dly1 relative to CON. The Refresh Enable signal REFN is set to a state that is reverse to that of the Command Output Enable signal CON.

Under control of the above Command Output Enable signal CON, the command buffer 120 outputs DRAM access commands. Since the ratio of duration of high level to that of low level in the CON is 1:1, in the sequence of DRAM access commands, every 2 (second) clock cycles are taken as one group and access commands are arranged only in the first clock cycle of each group. In the clock cycle during which no access command is arranged, the refresh controller controls DRAM so that it is refreshed. On the other hand, the sequence of DRAM read data has a first delay dly1 relative to the sequence of DRAM access commands, but with a same distribution, that is, every 2 clock cycles are taken as one group, and the read data is only contained in the first clock cycle in each group. For data read from DRAM as described above, the data buffer 130 transmits the read data to the user interface at the first clock CLK1, as shown by user side read data. Finally, at two (first) clock cycles after receiving user side access command, the intermediate circuit presents the read data at the user interface. Thus, in the example of FIG. 5, the second delay dly2=2CLK1.

In the examples from FIG. 3 to FIG. 5, timing of respective signals in the intermediate circuit are described in conjunction with clock ratios of 4:3, 4:1 and 2:1, respectively. As mentioned above, the first delay dly1 is relevant to data read delay dly0 of the DRAM itself. Generally, the first delay dly1 is greater than or equal to dly0, and dly0 is greater than or equal to operating clock cycle CLK2 of the DRAM itself. In all of the above examples, it is assumed that dly1=CLK2. The finally obtained fixed latency dly2 is relevant to clock ratio CLK1/CLK2 of the first clock cycle and the second clock cycle and to dly1. It can be seen that, when clock ratio is less than or equal to 2 and dly1=CLK2, such as the case in FIG. 3 and FIG. 5, the finally obtained fixed latency dly2=2CLK1. When clock ratio is greater than 2 and dly1=CLK2, such as the clock ratio of 4:1 in FIG. 4, the obtained fixed latency dly2=CLK1. When dly1 is greater than CLK2, accordingly, the obtained fixed latency dly2 is greater than the above value.

In addition, in the examples from FIG. 3 to FIG. 5, there is also shown a Command Input Enable signal CIN and a Data Output Enable signal DON, both of which are in an enabled state, and the Data Output Enable signal DON has a second delay relative to the Command Input Enable signal CIN. However, it is appreciated that, similar to setting of the Data Read Enable signal DRN, setting of the two signals CIN and DON are merely to show the second delay dly2 more clearly. If the command buffer is set to continuously receive access command from user interface, the data buffer is set to continuously output obtained data in turn at the first clock once obtaining DRAM read data, then even without control of the above two signals, the above fixed latency dly2 will also occur between user side access command and user side read data. However, by setting the Command Input Enable signal CIN and the Data Output Enable signal DON, in addition that the second delay can be shown more clearly, presentation time of user side read data may be further delayed on basis of naturally generated second delay dly2. For example, in the example of FIG. 4, dly2=CLK1. However, it is appreciated that, by setting the delay between the Command Input Enable signal CIN and the Data Output Enable signal DON as 2CLK1, it is also possible to make user side read data has a delay of 2CLK1 relative to user side access command, thereby obtaining fixed access latency 2CLK1.

Next, relationship of ratio between access operation and refresh operation and data integrity will be analyzed. Assume retention time of data in DRAM is T, and operating frequency of DRAM is F. Then, total operation cycles in time T is T*F. Assume to maintain data integrity, at least M operation cycles are required in the retention time to perform mandatory refresh operation, then a ratio of refresh operation to access operation is at least:

$$Rmin=M/(T*F-M)$$

Further, assume a DRAM contains N banks, each bank contains Nr rows, then in case of single pipeline operation in which one operation is completed in one clock cycle, M=N*Nr.

Specifically, in 32 nm technology, data retention time T=41 µs, operating frequency F=600 MHz, Nr=128. Assume number of banks is 32, then Rmin is about 1:5. Recently, many optimized refresh methods have been proposed for DRAM, such as Concurrent Refresh (CCR) mode. The CCR mode allows accessing one bank while refreshing another bank. The above ratio Rmin is further reduced under this mode.

Theoretically, as long as ratio R of refresh operation to access operation is higher than the above Rmin, it can be ensured that, by planning refresh scheme, data in DRAM will not get lost. In the examples from FIG. 3 to FIG. 5, ratio of refresh operation to access operation is 1:3, 3:1 and 1:1 respectively, all of which are far above the Rmin, thus data integrity can be ensured. Further, according to relationship of refresh operation and access operation and two clock cycles, for user interface and DRAM that meet the requirement of (CLK1-CLK2)/CLK2>Rmin, the above intermediate circuit may be employed to arrange refresh operation and access operation, thereby obtaining a fixed access latency.

In an embodiment, difference (CLK1-CLK2) between clock cycles of user interface and DRAM is relatively large, thus providing much slots to insert refresh operation, as shown by the example in FIG. 4. However, in some cases, DRAM may not wish to frequently perform refresh operation. Then, in one embodiment, the control circuit 110 may further modify the Refresh Enable signal REFN. For instance, in one example, the control circuit 110 further includes an adjuster (not shown) configured to obtain a Refresh Enable signal REFN from the inverter of FIG. 2, and modify a predefined proportion of first state (high level) in the signal REFN to second state (low level) according to a predetermined setting, so as to generate a modified Refresh Enable signal. For example, for the Refresh Enable signal REFN in FIG. 4, ⅓ of its high level may be modified as low level. Thus, in a group composed of 4 (second) clock cycles, 1 clock cycle is used to perform data access operation, 2 clock cycles are used to perform refresh operation, and within the remaining 1 clock cycle, DRAM does not perform any operation. Modification of Refresh Enable signal does not means modification of Command Output Enable signal. In addition, although the Refresh Enable signal may be modified, ratio of refresh operation to access operation according to the modified signal should also be made to be greater than the above Rmin.

In the above embodiments, there is concurrent rising edge between first clock CLK1 of user interface and second clock CLK2 of DRAM. For such a case, it is considered that the first clock CLK1 and the second clock CLK2 are synchronous. However, embodiments of the invention are also applicable to the case that two clocks are not synchronous.

In one embodiment, assume CLK1 and CLK2 are asynchronous clock signals from different clock domains. In such a case, a synchronizer (not shown) can be added at the command buffer and data buffer (location of dashed line) in FIG. 1, so as to synchronize the two clock signals. In one example, a synchronizer with two-stage latch structure is employed. In another example, a FIFO-based synchronizer is used. Since clock synchronization is a common problem in designing a circuit in the art, those skilled in the art can employ appropriate synchronizer across clock domains according to different clock ratio CLK1/CLK2. It is appreciated that, introduction of a synchronizer may bring further delay. However, that further delay is also a fixed value, and finally, the read data can be obtained from the user interface still with a fixed access latency.

When the intermediate circuit 100 is described in conjunction with the above specific examples, properties and operating modes of DRAM and refresh controller are not limited. Therefore, the intermediate circuit 100 of embodiments of the invention is applicable to various different DRAMs such as embedded DRAM (eDRAM) and corresponding refresh controller, so as to hide refresh confliction of a DRAM at user interface and provide a fixed access latency.

Under a same inventive conception, the invention also provides a method for hiding refresh confliction of a DRAM at user interface.

Figure 6:
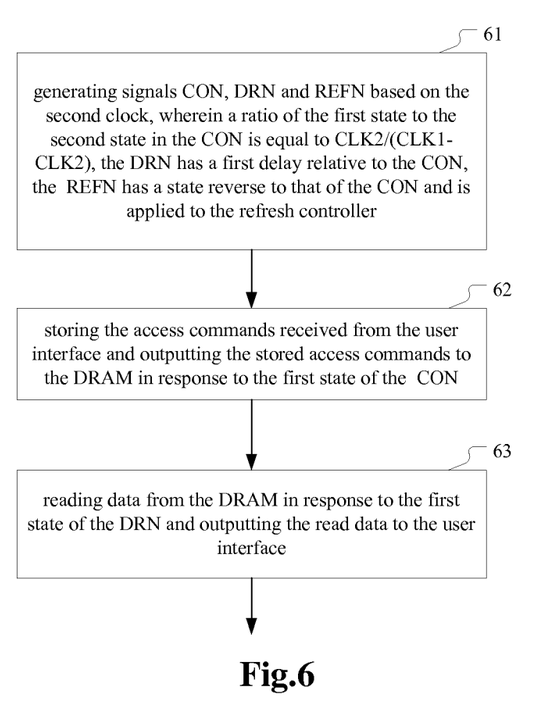
FIG. 6 shows a flowchart of a method according to yet another embodiment of the present invention.

FIG. 6 shows a flowchart of a method according to one embedment of the present invention, which is for hiding refresh confliction of a DRAM at user interface, where the user interface transmits access commands at a first clock, the DRAM operates at a second clock and is refreshed via a refresh controller. Clock cycle CLK1 of the first clock is greater than clock cycle CLK2 of the second clock. As shown in FIG. 6, the method includes: Step 61, generating a Command Output Enable signal CON and a Refresh Enable signal REFN based on the second clock, where the Command Output Enable signal CON has a first state and a second state, a ratio of duration of the first state to that of the second state is equal to CLK2/(CLK1-CLK2), the Refresh Enable signal REFN has a state that is reverse to that of the Command Output Enable signal CON and is applied to the refresh controller; step S62, storing the access commands received from the user interface and outputting the stored access commands to the DRAM when the Command Output Enable signal CON is in the first state; and step 63, reading data from the DRAM and outputting the read data to the user interface.

In one embodiment, generating a Command Output Enable signal CON in step 61 includes the following sub-steps: counting the second clock and resetting count value whenever the count value reaches a predetermined value, and generating the Command Output Enable signal CON and setting state of the Command Output Enable signal CON according to the count value, such that the ratio of the first state to the second state is CLK2/(CLK1-CLK2).

In one embodiment, the ratio of CLK1 to CLK2 is m:n, where m and n are natural numbers. Here, the step of counting the second clock includes: starting counting from 0, and resetting count value to 0 after the count value reaches m-1. The step of generating the Command Output Enable signal CON includes: generating a signal in the first state when the count value is 0 to n-1, and generating a signal in the second state when the count value is n to m-1.

In one embodiment, step 61 further includes: delaying the Command Output Enable signal CON by a first delay time, thereby obtaining a Data Read Enable signal DRN, and step 63 includes: reading data from the DRAM when the Data Read Enable signal DRN is in a first state.

In one embodiment, generating a Refresh Enable signal REFN in step 61 includes: inverting state of the Command Output Enable signal CON, thereby obtaining the Refresh Enable signal REFN.

In one embodiment, the method further includes: generating a Command Input Enable signal CIN and a Data Output Enable signal DON, where the Data Output Enable signal DON has a second delay relative to the Command Input Enable signal CIN. Accordingly, the method further includes: reading the access commands from the user interface under control of the Command Input Enable signal CIN, and the step of outputting the read data to the user interface includes: outputting the read data to the user interface under control of the Data Output Enable signal DON.

In one embodiment, the second delay is set to be greater than or equal to 2CLK1 when CLK1/CLK2 is less than or equal to 2, and the second delay is set to be greater than or equal to CLK1 when CLK1/CLK2 is greater than 2.

In one embodiment, the method further includes: obtaining the Refresh Enable signal REFN, and modifying a predefined proportion of the first state in the Refresh Enable signal REFN to the second state according to a predetermined setting, so as to generate modified Refresh Enable signal.

In one embodiment, the first clock and the second clock are from different clock domains. In such a case, the method further includes: synchronizing the first clock and the second clock.

For execution result of the method shown in FIG. 6, reference can be made to the examples of FIG. 2 to FIG. 5, the description of which will be omitted here.

It is appreciated that, the method shown in FIG. 6 may either be implemented by a hardware circuit such as in FIG. 2, or be implemented in form of software (including firmware, resident software, micro code etc), or be implemented in form of combinations of hardware and software. In some embodiments, the invention may also be implemented in form of a computer program product embodied in one or more computer readable medium(s) having computer readable program code embodied thereon. Program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An intermediate circuit for DRAM, the intermediate circuit coupled between a user interface and the DRAM, the user interface transmitting access commands at a first clock, the DRAM operating at a second clock and being refreshed via a refresh controller, wherein clock cycle of the first clock is greater than clock cycle of the second clock, the intermediate circuit comprising:
   a first control circuit configured to generate a Command Output Enable signal and a Refresh Enable signal based on the second clock, wherein the Command Output Enable signal has a first state and a second state, wherein a ratio of duration of the first state to that of the second state is the second clock cycle divided by the difference between the first clock cycle and the second clock cycle, and wherein the Refresh Enable signal has a state that is reverse to that of the Command Output Enable signal and is applied to the refresh controller;
   a command buffer configured to i) store the access commands received from the user interface and ii) output the stored access commands to the DRAM when the Command Output Enable signal is in the first state; and
   a data buffer configured to read data from the DRAM and output the read data to the user interface.

2. The intermediate circuit according to claim 1, wherein the first control circuit comprises:
   a counter configured to count the second clock and reset count value whenever the count value reaches a predetermined value; and
   a signal generator configured to generate the Command Output Enable signal and set state of the Command Output Enable signal according to count value of the counter, such that the ratio of duration of the first state to that of the second state is the second clock cycle divided by the difference between the first clock cycle and the second clock cycle.

3. The intermediate circuit according to claim 2, wherein a ratio of the first clock cycle to the second clock cycle is m:n, where m and n are natural number, wherein the counter is configured to start counting from 0 and is reset to 0 after the count value reaches m-1, wherein the signal generator is configured to i) generate a signal in the first state when count value of the counter is 0 to n-1 and to ii) generate a signal in the second state when count value of the counter is n to m-1.

4. The intermediate circuit according to claim 1, wherein the first control circuit comprises: a delayer configured to delay the Command Output Enable signal by a first delay time, thereby obtaining a Data Read Enable signal, and wherein the data buffer is configured to read data from the DRAM when the Data Read Enable signal is in a first state.

5. The intermediate circuit according to claim 1, wherein the command buffer and the data buffer are implemented by a First-In-First-Out type buffer.

6. The intermediate circuit according to claim 1 further comprising:
   a second control circuit configured to generate a Command Input Enable signal and a Data Output Enable signal, wherein the Data Output Enable signal DON has a second delay relative to the Command Input Enable signal, wherein the command buffer is configured to receive access commands from the user interface under control of the Command Input Enable signal CIN, and wherein the data buffer is configured to output data to the user interface under control of the Data Output Enable signal.

7. The intermediate circuit according to claim 6, wherein the second delay is set to be greater than or equal to twice the first clock cycle when the first clock cycle divided by the second clock cycle is less than or equal to 2, and wherein the second delay is set to be greater than or equal to the first clock cycle when the first clock cycle divided by the second clock cycle is greater than 2.

8. The intermediate circuit according to claim 1, wherein the first control circuit further comprises: an adjuster configured to i) obtain the Refresh Enable signal and ii) modify a predefined proportion of first state in the Refresh Enable signal to second state according to a predetermined setting, so as to generate a modified Refresh Enable signal.

9. The intermediate circuit according to claim 1, wherein the first clock and the second clock are from different clock domains, and the intermediate circuit further comprises: a synchronizer configured to synchronize the first clock and the second clock.

10. A method for controlling DRAM, the method being performed between a user interface and the DRAM, the user interface transmitting access commands at a first clock, the DRAM operating at a second clock and being refreshed via a refresh controller, wherein a clock cycle of the first clock is greater than a clock cycle of the second clock, the method comprising:
    generating a Command Output Enable signal and a Refresh Enable signal based on the second clock, wherein the Command Output Enable signal has a first state and a second state, a ratio of duration of the first state to that of the second state is the second clock cycle divided by the difference between the first clock cycle and the second clock cycle, the Refresh Enable signal has a state that is reverse to that of the Command Output Enable signal and is applied to the refresh controller;
    storing the access commands received from the user interface;
    outputting the stored access commands to the DRAM when the Command Output Enable signal is in the first state; and
    reading data from the DRAM and outputting the read data to the user interface.

11. The method according to claim 10, wherein the step of generating a Command Output Enable signal based on the second clock comprises:
    counting the second clock;
    resetting count value whenever the count value reaches a predetermined value; and
    generating the Command Output Enable signal and setting state of the Command Output Enable signal according to the count value, such that the ratio of duration of the first state to that of the second state is the second clock cycle divided by the difference between the first clock cycle and the second clock cycle.

12. The method according to claim 11, wherein a ratio of the first clock cycle to the second clock cycle is m:n, where m and n are natural number, wherein the step of counting the second clock and resetting count value comprises: starting counting from 0, and resetting count value to 0 after the count value reaches m-1, wherein the step of generating the Command Output Enable signal comprises: generating a signal in the first state when the count value is 0 to n-1, and generating a signal in the second state when the count value is n to m-1.

13. The method according to claim 10 further comprising: delaying the Command Output Enable signal by a first delay time, thereby obtaining a Data Read Enable signal, and wherein the step of reading data from the DRAM comprises: reading data from the DRAM when the Data Read Enable signal DRN is in a first state.

14. The method according to claim 10, wherein the step of generating a Refresh Enable signal comprises: inverting the state of the Command Output Enable signal, thereby obtaining the Refresh Enable signal REFN.

15. The method according to claim 10 further comprising: generating a Command Input Enable signal and a Data Output Enable signal, wherein the Data Output Enable signal DON has a second delay relative to the Command Input Enable signal; and
receiving the access commands from the user interface under control of the Command Input Enable signal C, wherein the step of outputting the read data to the user interface comprises: outputting the read data to the user interface under control of the Data Output Enable signal.

16. The method according to claim 15, wherein the second delay is set to be greater than or equal to twice the first clock cycle when the first clock cycle divided by the second clock cycle is less than or equal to 2, and wherein the second delay is set to be greater than or equal to the first clock cycle when the first clock cycle divided by the second clock cycle is greater than 2.

17. The method according to claim 10 further comprising: obtaining the Refresh Enable signal;
modifying a predefined proportion of first state in the Refresh Enable signal REFN to second state according to a predetermined setting, so as to generate modified Refresh Enable signal.

18. The method according to claim 10, wherein the first clock and the second clock are from different clock domains, and wherein the method further comprises: synchronizing the first clock and the second clock.

* * * * *